(12) United States Patent
Kim et al.

(10) Patent No.: US 12,602,297 B2
(45) Date of Patent: Apr. 14, 2026

(54) PROCESSOR AND METHOD OF DETECTING SOFT ERROR USING THE SAME

(71) Applicant: Samsung Electronics Co., Ltd., Suwon-si (KR)

(72) Inventors: Taesun Kim, Suwon-si (KR); Jinhong Park, Suwon-si (KR); Hwisoo So, Seoul (KR); Kyoungwoo Lee, Seoul (KR); Jinhyo Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 199 days.

(21) Appl. No.: 18/461,120

(22) Filed: Sep. 5, 2023

(65) Prior Publication Data

US 2024/0080044 A1     Mar. 7, 2024

(30) Foreign Application Priority Data

Sep. 7, 2022   (KR) ........................ 10-2022-0113765
Dec. 7, 2022   (KR) ........................ 10-2022-0169753

(51) Int. Cl.
 *G06F 11/00*       (2006.01)
 *G06F 11/1497*     (2026.01)
 *H03M 13/11*       (2006.01)

(52) U.S. Cl.
 CPC ..... *G06F 11/1497* (2013.01); *H03M 13/1111* (2013.01)

(58) Field of Classification Search
 CPC ........................ G06F 11/1497; G06F 2201/83

USPC ...................................................... 714/1–57
See application file for complete search history.

(56) References Cited

U.S. PATENT DOCUMENTS

| | | | |
|---|---|---|---|
| 7,506,217 B2 | 3/2009 | Borin et al. | |
| 7,793,261 B1 * | 9/2010 | Edwards ............. | G06F 11/3656 |
| | | | 717/124 |
| 8,402,328 B2 | 3/2013 | Wang et al. | |
| 9,235,461 B2 | 1/2016 | Palframan et al. | |
| 9,557,936 B2 | 1/2017 | Anderson et al. | |
| 10,095,591 B2 | 10/2018 | Kang et al. | |
| 10,296,312 B2 | 5/2019 | Shrivastava et al. | |
| 10,424,042 B2 | 9/2019 | Uhrenholt et al. | |
| 10,656,992 B2 | 5/2020 | Anand et al. | |
| 10,997,027 B2 | 5/2021 | Didehban et al. | |
| 2002/0066080 A1 * | 5/2002 | O'Dowd ............. | G06F 11/3644 |
| | | | 717/124 |

(Continued)

OTHER PUBLICATIONS

Extended European Search Report corresponding to EP Application No. 23193935.6; dated Feb. 19, 2024 (12 pages).

(Continued)

*Primary Examiner* — Sarai E Butler
(74) *Attorney, Agent, or Firm* — Wolf, Greenfield & Sacks, P.C.

(57)           ABSTRACT

The method of detecting a soft error includes copying, in a program loaded into a memory, an original branch command to a copied branch command, executing, by a processor, a first command set comprising the copied branch command, executing, by a processor, a second command set comprising the original branch command, and determining, by a soft error detection circuit, whether an error exists in the execution of the original branch command based on the execution result of the first command set and the second command set.

19 Claims, 12 Drawing Sheets

(56)     References Cited

U.S. PATENT DOCUMENTS

| | | | |
|---|---|---|---|
| 2004/0019771 A1* | 1/2004 | Quach .................... | G06F 11/165 |
| | | | 714/E11.061 |
| 2008/0215920 A1* | 9/2008 | Mayer ..................... | G06F 11/28 |
| | | | 714/38.1 |
| 2008/0244354 A1* | 10/2008 | Wu ..................... | G06F 11/1479 |
| | | | 714/755 |
| 2009/0113240 A1* | 4/2009 | Vera .................... | G06F 11/1497 |
| | | | 714/E11.178 |
| 2009/0119493 A1* | 5/2009 | Venkitachalam ... | G06F 9/45558 |
| | | | 718/1 |
| 2013/0318327 A1* | 11/2013 | Gammel ............. | G06F 11/0763 |
| | | | 712/220 |
| 2017/0242778 A1* | 8/2017 | Terras ..................... | G06F 21/44 |
| 2017/0337047 A1* | 11/2017 | Shrivastava ........ | G06F 9/30043 |
| 2019/0102180 A1 | 4/2019 | Hari et al. | |
| 2019/0303158 A1* | 10/2019 | Brar ........................ | G06F 8/658 |
| 2019/0378542 A1* | 12/2019 | Didehban ........... | G06F 11/0793 |

OTHER PUBLICATIONS

Ko, Yohan, et al., "Selective Code Duplication for Soft Error Protection on VLIW Architectures", Electronics 10: 1835, 2021.
Shafik, Rishad A., et al., "Software Modification Aided Transient Error Tolerance for Embedded Systems", 2013 16th Euromicro Conference on Digital System Design, IEEE, Sep. 2013, 219-226.

* cited by examiner

CBK (SIG1)

RG1

RG2

GSR = GSR - DV

RTS = VA1
BRANCH if (R1* == R2*) RG3
RTS = VA2

RG3

RG4

GSR = GSR + RV

BRANCH if (R1 == R2) BBK1

JUMP BBK2

CBK (SIG1)

RG1

RG2

GSR = GSR - DV

RTS = VA1
BRANCH if (R1* == R2*) RG3
RTS = VA2

RG3

RG4

GSR = GSR + RV

BRANCH if (R1 == R2) BBK1

JUMP BBK2

S180

EXECUTE XOR FOR GLOBAL SIGNATURE VALUE AND RUNTIME SIGNATURE VALUE ⸺ S182

COMPARE XOR RESULT WITH UNIQUE SIGNATURE VALUES OF BRANCH COMMAND BLOCK ⸺ S184

GENERATE ERROR DETECTION RESULT ON EXECUTION OF ORIGINAL BRANCH COMMAND BASED ON COMPARISON RESULT ⸺ S186

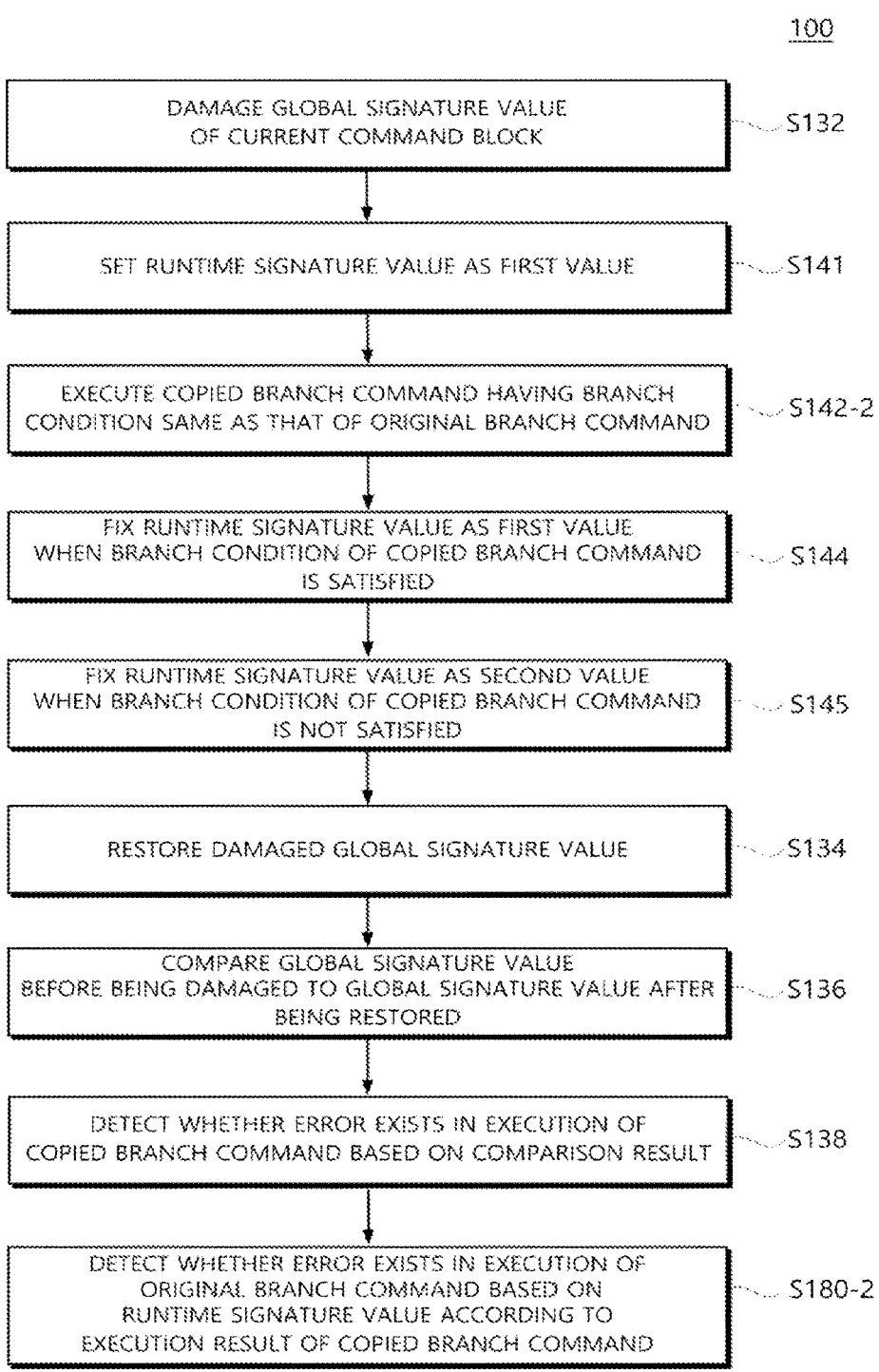

100

DAMAGE GLOBAL SIGNATURE VALUE
OF CURRENT COMMAND BLOCK — S132

SET RUNTIME SIGNATURE VALUE AS FIRST VALUE — S141

EXECUTE COPIED BRANCH COMMAND HAVING BRANCH
CONDITION SAME AS THAT OF ORIGINAL BRANCH COMMAND — S142-2

FIX RUNTIME SIGNATURE VALUE AS FIRST VALUE
WHEN BRANCH CONDITION OF COPIED BRANCH COMMAND
IS SATISFIED — S144

FIX RUNTIME SIGNATURE VALUE AS SECOND VALUE
WHEN BRANCH CONDITION OF COPIED BRANCH COMMAND
IS NOT SATISFIED — S145

RESTORE DAMAGED GLOBAL SIGNATURE VALUE — S134

COMPARE GLOBAL SIGNATURE VALUE
BEFORE BEING DAMAGED TO GLOBAL SIGNATURE VALUE AFTER
BEING RESTORED — S136

DETECT WHETHER ERROR EXISTS IN EXECUTION OF
COPIED BRANCH COMMAND BASED ON COMPARISON RESULT — S138

DETECT WHETHER ERROR EXISTS IN EXECUTION OF
ORIGINAL BRANCH COMMAND BASED ON
RUNTIME SIGNATURE VALUE ACCORDING TO
EXECUTION RESULT OF COPIED BRANCH COMMAND — S180-2

FIG. 11

PROCESSOR AND METHOD OF DETECTING SOFT ERROR USING THE SAME

CROSS-REFERENCE TO RELATED APPLICATION(S)

This application claims priority under 35 U.S.C. § 119 to Korean Patent Application No. 10-2022-0113765, filed on Sep. 7, 2022, and Korean Patent Application No. 10-2022-0169753, filed on Dec. 7, 2022, in the Korean Intellectual Property Office, the disclosure of which are incorporated herein by reference in their entireties.

BACKGROUND

The present disclosure relates to error detection, and more particularly, to a processor and a method of detecting a soft error using the same.

A soft error or a transient fault denotes an error in which a bit value stored in a semiconductor device such as a transistor is changed from "0" to "1" or vice versa due to external factors, regardless of a permanent fault of hardware such as a collision of neutrons or alpha particles. Damage on a bit value occurring due to a soft error may cause a fatal malfunction in operating a processor.

In this regard, there is a demand for the accurate detection of a soft error before a fatal malfunction is caused in operating a device or a system.

SUMMARY

The present disclosure provides a processor which may accurately detect a soft error and thereby, prevent a malfunction occurring due to a soft error, and a method of detecting a soft error using the same.

According to some embodiments of the present disclosure, a method of detecting a soft error includes copying, in a program loaded into a memory, an original branch command to a copied branch command, executing, by the processor, a first command set comprising the copied branch command, executing, by the processor, a second command set comprising the original branch command, and determining, by a soft error detection circuit, whether an error exists in the execution of the original branch command based on an execution result of the first command set and the second command set.

According to some embodiments of the present disclosure, a processor is operated by using the method of detecting a soft error above and outputs an error detection signal when an error exists in execution of the original branch command.

According to some embodiments of the present disclosure, a method of detecting a soft error includes damaging, by a processor, a global signature value of a current command block, executing, by the processor, a copied branch command which corresponds to an original branch command, restoring, by the processor, the damaged global signature value, comparing, by the processor, the global signature value before being damaged to the global signature value after being restored, and determining whether an error exists in the execution of the copied branch command based on the comparison result.

According to some embodiments of the present disclosure, a method of detecting a soft error includes copying, into a program loaded into a memory, an original branch command to a copied branch command, executing, by a processor, the original branch command and the copied branch command, determining, by the processor, a global signature value for a current block of the memory in which the copied branch command is executed, damaging the global signature value by subtracting a damage value from the global signature value, and restoring the global signature value that was damaged by adding a restore value to the global signature value that was damaged, and determining whether an error exists in the execution of the copied branch command based on comparing the global signature value before being damaged to the global signature value after being restored.

BRIEF DESCRIPTION OF DRAWINGS

The above and other features and advantages of the present disclosure will become more apparent by describing in detail example embodiments thereof with reference to the attached drawings in which:

FIG. 11 is a flowchart illustrating a method of detecting a soft error according to some embodiments of the present disclosure;

DETAILED DESCRIPTION

Hereinafter, embodiments of the present disclosure may be described in detail and clearly to such an extent that an ordinary one in the art easily implements the present disclosure.

Figure 1:
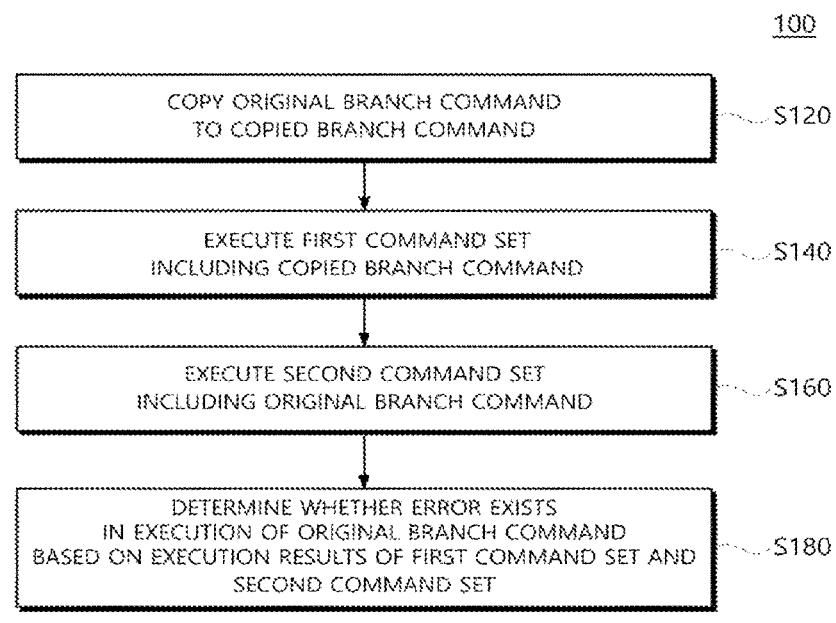
FIG. 1 is a flowchart illustrating a method of detecting a soft error according to some embodiments of the present disclosure.
Figure 2:
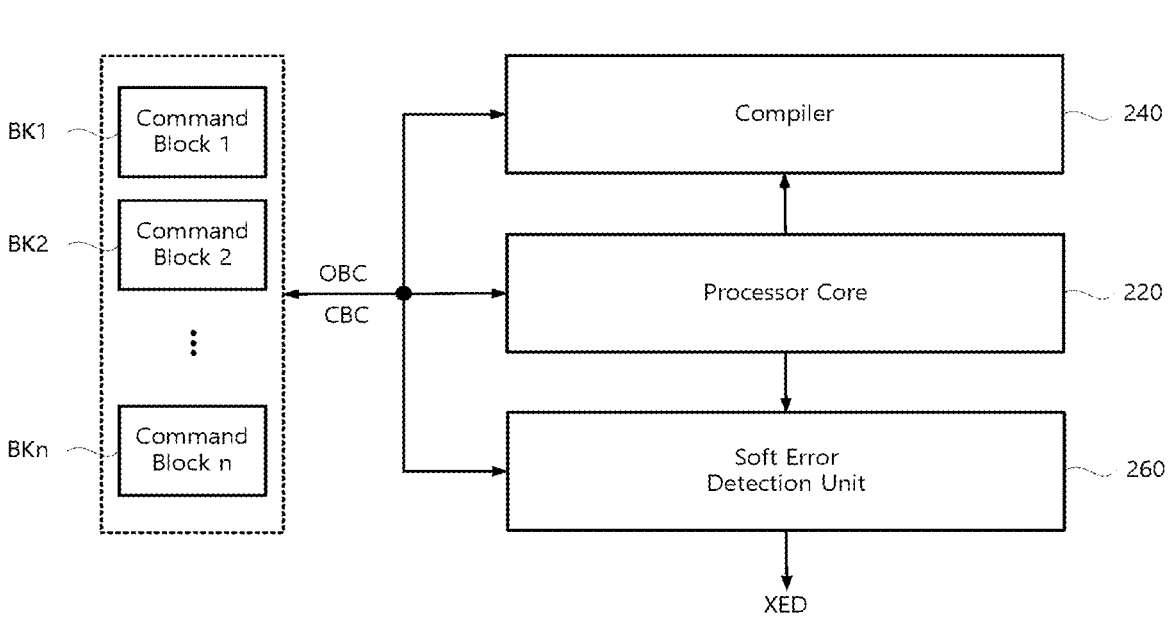
FIG. 2 illustrates a processor which detects a soft error by using a method of detecting a soft error according to some embodiments of the present disclosure.
Figure 3:
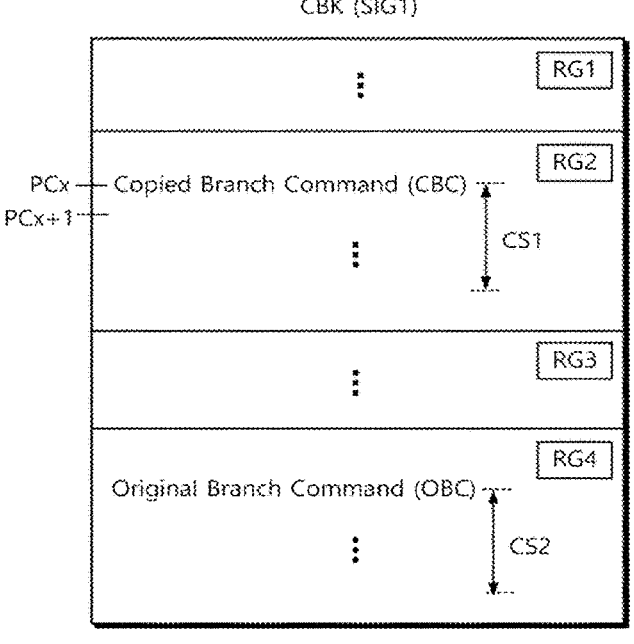
FIG. 3 illustrates a command block according to some embodiments of the present disclosure.

FIG. 1 is a flowchart illustrating a method 100 of detecting a soft error according to some embodiments of the present disclosure, FIG. 2 illustrates a processor 200 which detects a soft error by using the method 100 of detecting a soft error according to some embodiments of the present disclosure, and FIG. 3 illustrates a command block CBK according to some embodiments of the present disclosure.

Referring to FIGS. 1 through 3, the method 100 of detecting a soft error according to some embodiments of the present disclosure and the processor 200 may be used to detect a soft error existing in execution of applications. In this regard, operating reliability of the processor 200, which executes applications, may be secured. Here, the applications may be programs or software such as software modules or software components which may be executed by the processor 200 according to some embodiments of the present disclosure. The applications may be formed of a plurality of commands. The soft error denotes a transient error in which a bit value stored in a semiconductor device is unintentionally changed due to external factors, regardless of a permanent fault of hardware. One of the external factors that causes a soft error may be neutrons in the air surrounding the semiconductor device. The processor 200 may further include one or more memories into which a program is loaded.

The method 100 of detecting a soft error according to some embodiments of the present disclosure includes copying an original branch command OBC to a copied branch command CBC in operation S120, executing a first command set CS1 including the copied branch command CBC in operation S140, executing a second command set CS2 including the original branch command OBC in operation S160, and determining whether an error exists in the execution of the original branch command OBC based on existence of an error in the execution of the first command set CS1 and the second command set CS2 in operation S180.

The original branch command OBC may be one of the original commands. The copied branch command CBC may be one of the copied commands generated by copying an original command. The original commands and the copied commands may include various commands used to execute applications such as 'ADD' (addition) commands, 'MULT' (multiplication) commands, 'XOR' (exclusive OR) commands, 'STR' (store) commands, 'JUMP' commands, 'BRANCH' commands, 'COMPARE' commands, and/or 'MOV' (move) commands. A branch command is a command used to change a command execution flow or to call other routines such as a 'BRANCH' command or a 'JUMP' command. In this regard, a program counter after the execution of the branch command may not continue to the next command and thus the program counter for a corresponding 'BRANCH' command or 'JUMP' command may have the command flow changed to another command block from a command block where the corresponding command is executed.

For example, when the copied branch command CBC is executed in a xth program counter PCx in the current command block CBK, a command flow may move to a location corresponding to another program counter instead of a (x+1)-th program counter PCx+1, within the current command block CBK commanded by the copied branch command CBC. Also, after the copied branch command CBC is executed in the current command block CBK, the command flow may move to another command block. The current command block CBK may be one of the command blocks BK1 through BKn. The current command block CBK may denote one of the command blocks BK1 through BKn where an original command and a copied command executed at the present point are located.

The first command set CS1 may include other commands along with the copied branch command CBC. The second command set CS2 may include other commands along with the original branch command OBC. The first command set CS1 including the copied branch command CBC and the second command set CS2 including the original branch command OBC may all be included in the current command block CBK. That is, the copied branch command CBC may be copied to a command block which is same as that of the original branch command OBC. However, the present disclosure is not limited thereto, and the first command set CS1 and the second command set CS2 may be located in different command blocks according to the algorithm applied to the method 100 of FIG. 1 of detecting a soft error or the processor 200 of FIG. 2 according to some embodiments of the present disclosure used to detect a soft error.

Figure 4A:
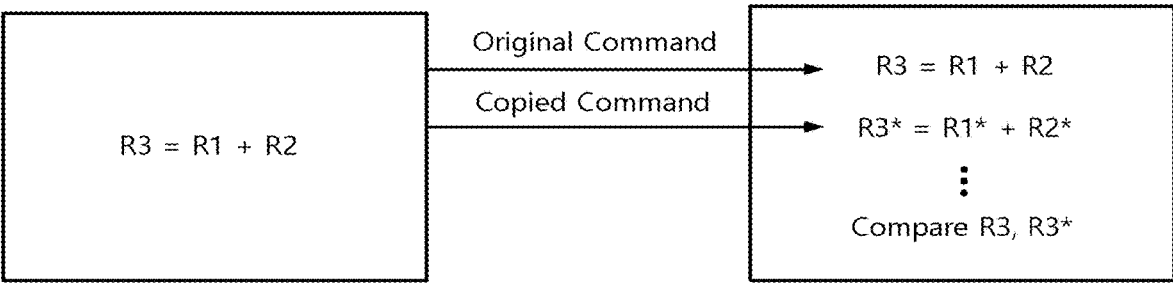
FIGS. 4A and 4B respectively illustrate examples of a soft error.
Figure 4B:
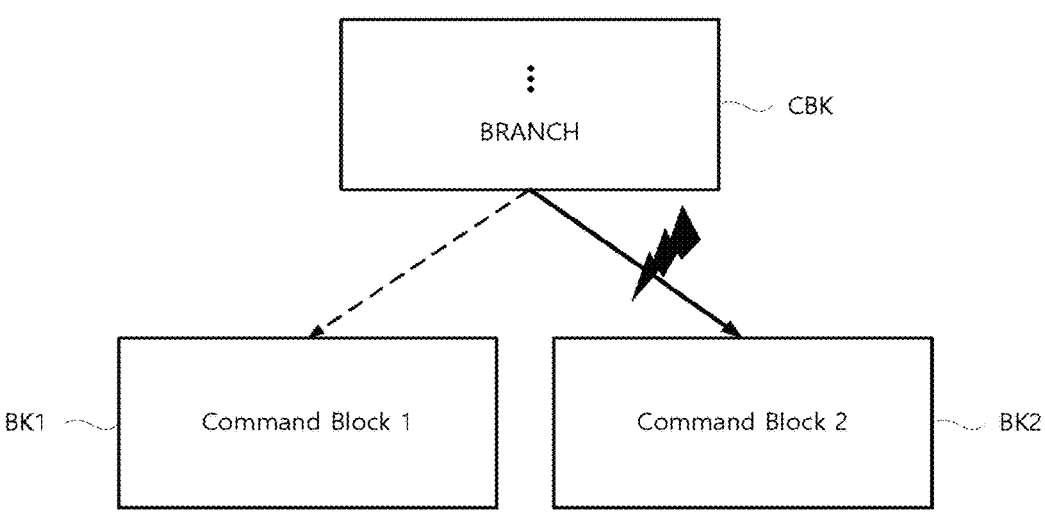

FIGS. 4A and 4B respectively illustrate examples of a soft error.

First, referring to FIGS. 2 and 4A, a soft error detection unit 260 according to some embodiments of the present disclosure may detect a soft error with respect to a data flow. The soft error detection unit 260 may include a soft error detection circuit comprising hardware and/or software. The soft error with respect to a data flow is an error, in which a data value is damaged, and does not cause a movement of the program counter or the command blocks BK1 through BKn.

FIG. 4A illustrates an example in which the original command is an 'ADD' command. In the 'ADD' command, a first original value R1 is added to a second original value R2 to make an original result value R3. The first original value R1 is stored in a first register, the second original value R2 is stored in a second register, and the original result value R3 is stored in the third register. Here, the same 'ADD' command is separately executed for a first copied command R1* copied from the first original value R1 and a second copied command R2* copied from the second original value R2 and thereby, the original command may be copied to a copied command. In FIG. 4A, if it is assumed that a result value of the original command, that is, the original result value R3, is damaged by an error, the original result value R3 of the original command may be compared to a copied result value R3* of the copied command to detect generation of an error.

Next, referring to FIGS. 2 and 4B, as a result of execution of a 'BRANCH' command which indicates a movement to a first command block BK1 in the current command block CBK, an error may occur in such a way that the command flow moves to a second command block BK2 instead of to the first command block BK1. Such an error defines a soft error for a control flow. Unlike a soft error for a data flow, the soft error for a control flow denotes that an execution order or an execution location of programs is damaged.

Accordingly, compared to the error for a data flow, the error for a control flow may not be easily detected. That is, the branch command in the control flow may be more vulnerable to errors. FIG. 4B illustrates the soft error for a control flow, especially, a wrong-direction error. In the soft error for a control flow, an unwanted-Jump error may also occur in such a way that a movement to the command blocks BK1 through BKn is accomplished according to the command from the original branch command OBC. However, a movement to a wrong location may occur within the command blocks BK1 through BKn.

Referring back to FIGS. 1 through 3, the method 100 of detecting a soft error using the processor 200 according to some embodiments of the present disclosure may be used to detect both a soft error in the data flow and/or a soft error in the control flow described above. Also, when the soft errors simultaneously occur in the data flow and in the control flow, the errors may be accurately detected by the method 100 of detecting a soft error using the processor 200 according to some embodiments of the present disclosure.

A method of protecting a system from the soft errors may include hardware-based techniques and/or software-based techniques. Here, the method 100 of detecting a soft error using the processor 200 according to some embodiments of the present disclosure may relate to the latter. The software-based method of detecting a soft error denotes that a change in hardware is not accompanied or that the change is somewhat insignificant. In software-based detecting of the soft error by using the method 100 of detecting a soft error using the processor 200 according to some embodiments of the present disclosure, the soft error may be accurately detected without using a conditional calculation.

The processor 200 according to some embodiments of the present disclosure may include a processor core 220, a compiler 240, the command blocks BK1 through BKn, and the soft error detection unit 260 to accurately detect a soft error by using the method 100 of detecting a soft error. The processor 200 may be a central processing unit, an application processor, or a dedicated processor such as a graphic processor, a data processor, and/or a communication processor. The processor 200 according to some embodiments of the present disclosure may be included in various processor-based devices or systems. For example, the processor 200 according to some embodiments of the present disclosure may be included in a navigation device, a communication device, a mobile phone, a computer, and/or a laptop computer.

The processor core 220 executes the first command set CS1 including the copied branch command CBC and the second command set CS2 including the original branch command OBC (operations S140 and S160). The processor core 220 may process an original command and a copied command for executing an application based on an Instruction Set Architecture (ISA) of a Reduced Instruction Set Computer-V (RISC-V). Also, the processor core 220 may execute applications based on a Complex Instruction Set Computer (CISC) or an Advanced RISC Machine (ARM).

The processor core 220 may include an arithmetic logic unit (ALU), a register set, and a controller for executing an original command and a copied command. The processor core 220 may be a multi-core.

The compiler 240 converts a source code of an application into a machine code for the processor core 220 to execute an original command. A copied command may be generated by copying an original command which is in a machine code version or an assembly language version converted by the compiler 240 (operation S120). That is, copying of the original command to the copied command may be performed by the compiler 240. The original branch command OBC and the copied branch command CBC respectively included in the original command and the copied command are generated in the same or a similar manner.

The compiler 240 may perform runtime compilation. The compiler 240 may be logic embodied with hardware such as a circuit and programmable logic, firmware, software, or a combination thereof. Also, in order to optimize or improve the execution of an application, the compiler 240 may divide the application into a plurality of command blocks BK1 through BKn. For example, each of the command blocks BK1 through BKn may be numbered by the first command block BK1 through an nth command block BKn.

In order to optimize operation of the compiler 240, a control flow graph indicating all traversable paths while executing the application may be used. The command blocks BK1 through BKn may each be processed as a node in the control flow graph.

The command blocks BK1 through BKn indicate a command flow for execution of an application by the processor 200. The command blocks BK1 through BKn may each include at least one of an "ADD' command, a 'MULT' command, an 'XOR' command, a 'STR' command, a 'JUMP' command, a 'BRANCH' command, a 'COMPARE' command, and/or a 'MOV' command. The command blocks BK1 through BKn may be basic blocks. In this case, the command blocks BK1 through BKn may be distinguished using an entry point and an exit point. That is, the command blocks BK1 through BKn may be defined as a straight-line code sequence in which branches entered to the corresponding command blocks BK1 through BKn do not exist except at the entry point, and exited branches do not exist except at the exit point. However, when the command blocks BK1 through BKn include a branch command, exit from the corresponding command blocks may be available through the branch command.

The soft error detection unit 260 determines whether an error exists in execution of the original branch command OBC (operation S180). That is, the soft error detection unit 260 may determine existence of an error in the execution of the copied branch command CBC from the execution result of the first command set CS1 (operation S140) and may determine existence of an error in the execution of the original branch command OBC (operation S180) based on the execution result of the first command set CS1 and the second command set CS2 (operations S140 and S160). The soft error detection unit 260 may output the determination result on existence of an error in the execution of the first command set CS1 and the second command set CS2 as an error detection signal XED.

The soft error detection unit 260 may be logic embodied with hardware such as a circuit and programmable logic, firmware, software, or a combination thereof. FIG. 2 illustrates that the soft error detection unit 260 operates separately from the compiler 240, however, the present disclosure is not limited thereto.

Figure 5:
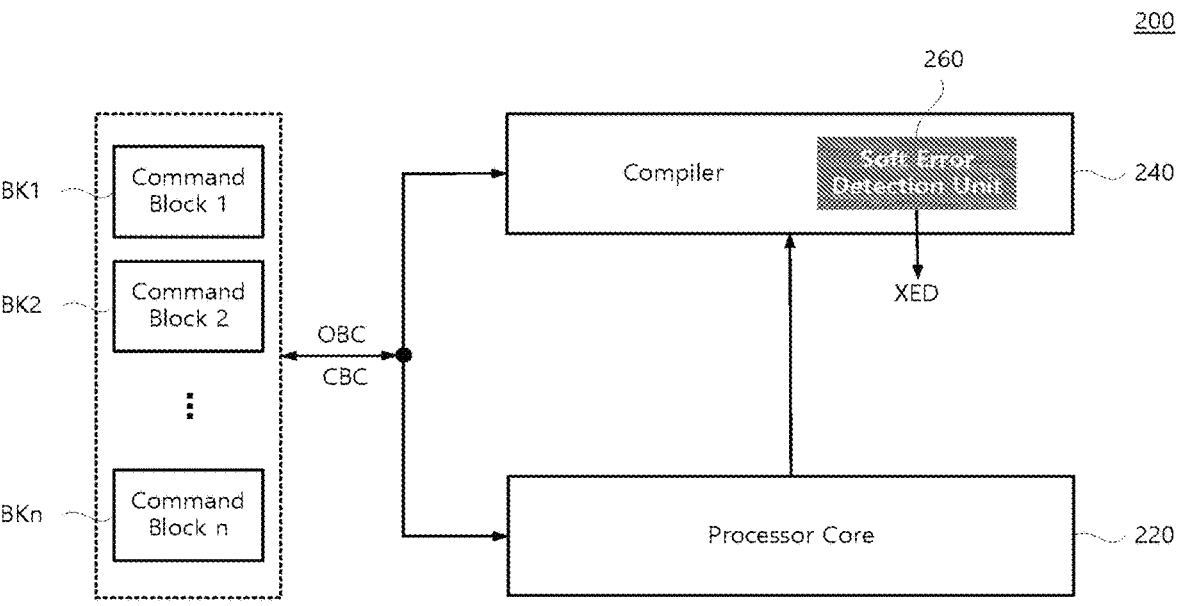
FIG. 5 illustrates a processor including a soft error detection unit and a compiler as one body according to some embodiments of the present disclosure.

FIG. 5 illustrates the processor 200 including the soft error detection unit 260 and the compiler 240 as one body according to some embodiments of the present disclosure.

Referring to FIG. 5, the soft error detection unit 260 and the compiler 240 included in the processor 200 according to some embodiments of the present disclosure may be prepared as one module. Here, the soft error detection unit 260 may be embodied as an error handling logic for at least one of three phases forming the compiler 240, that is, a front end, an optimizer, and/or a back end.

Referring back to FIGS. 1 through 3, the current command block CBK may be separated into four regions. Here, the first command set CS1 may be located in a second region RG2 and the second command set CS2 may be located in a fourth region RG4. Commands other than the first command set CS1 and the second command set CS2 may be located in regions except the second region RG2 and the fourth region RG4, such as the first region RG1 or the third region RG3

A first signature value SIG1 denotes a unique signature value of the current command block CBK. The unique signature value may be set for each of the command blocks BK1 through BKn to have a unique value. For example, the unique signature value for the first command block BK1 and the unique signature value for the second command block BK2 may be set differently from each other.

In the method 100 of detecting a soft error using the processor 200 according to some embodiments of the present disclosure, a global signature value that corresponds to the unique signature value is used to accurately detect a soft error. Hereinafter, the method of detecting a soft error by using the unique signature value according to some embodiments of the present disclosure will be described in more detail.

Figure 6:
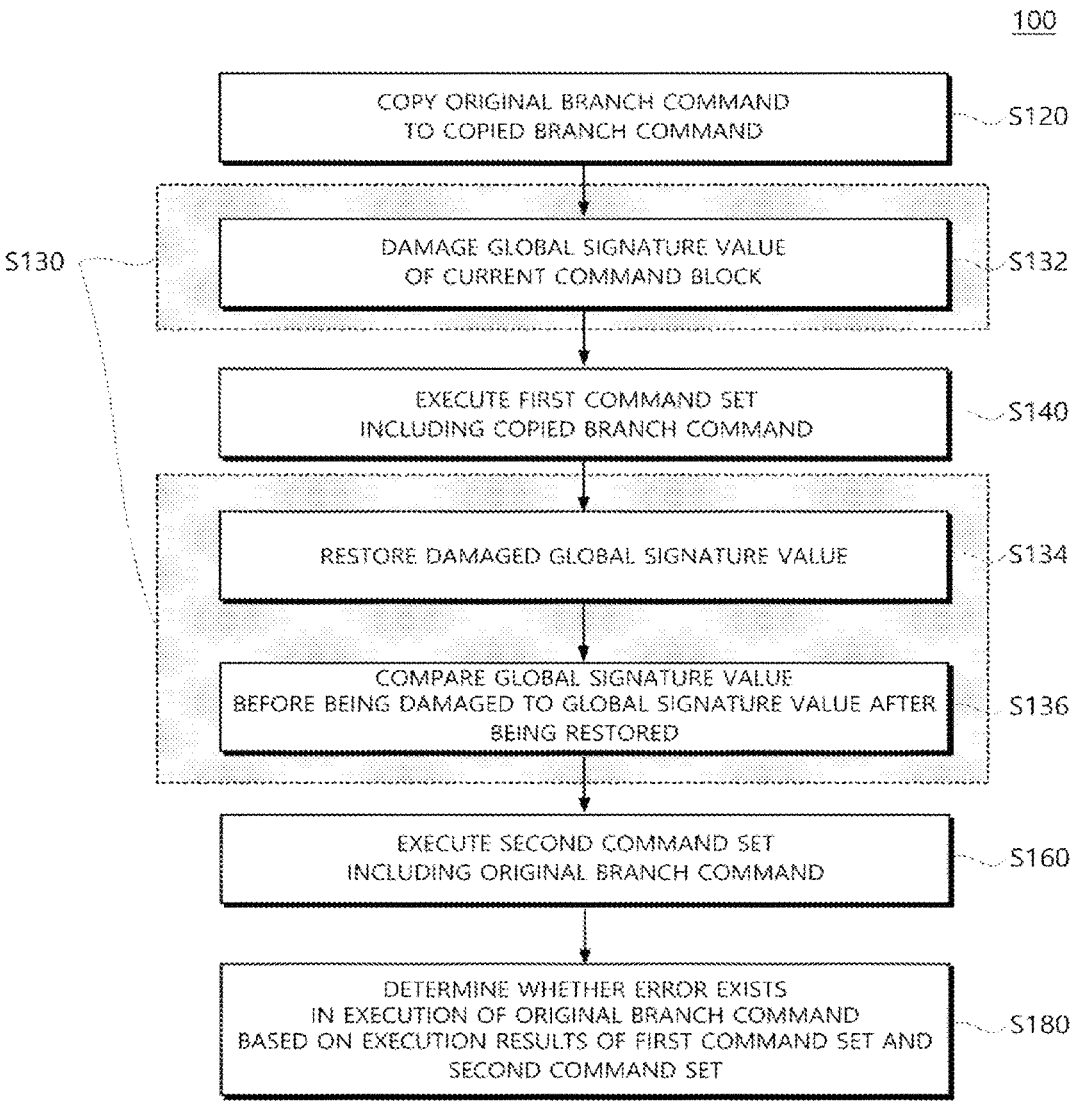
FIG. 6 is a flowchart illustrating a method of detecting a soft error according to some embodiments of the present disclosure.
Figure 7:
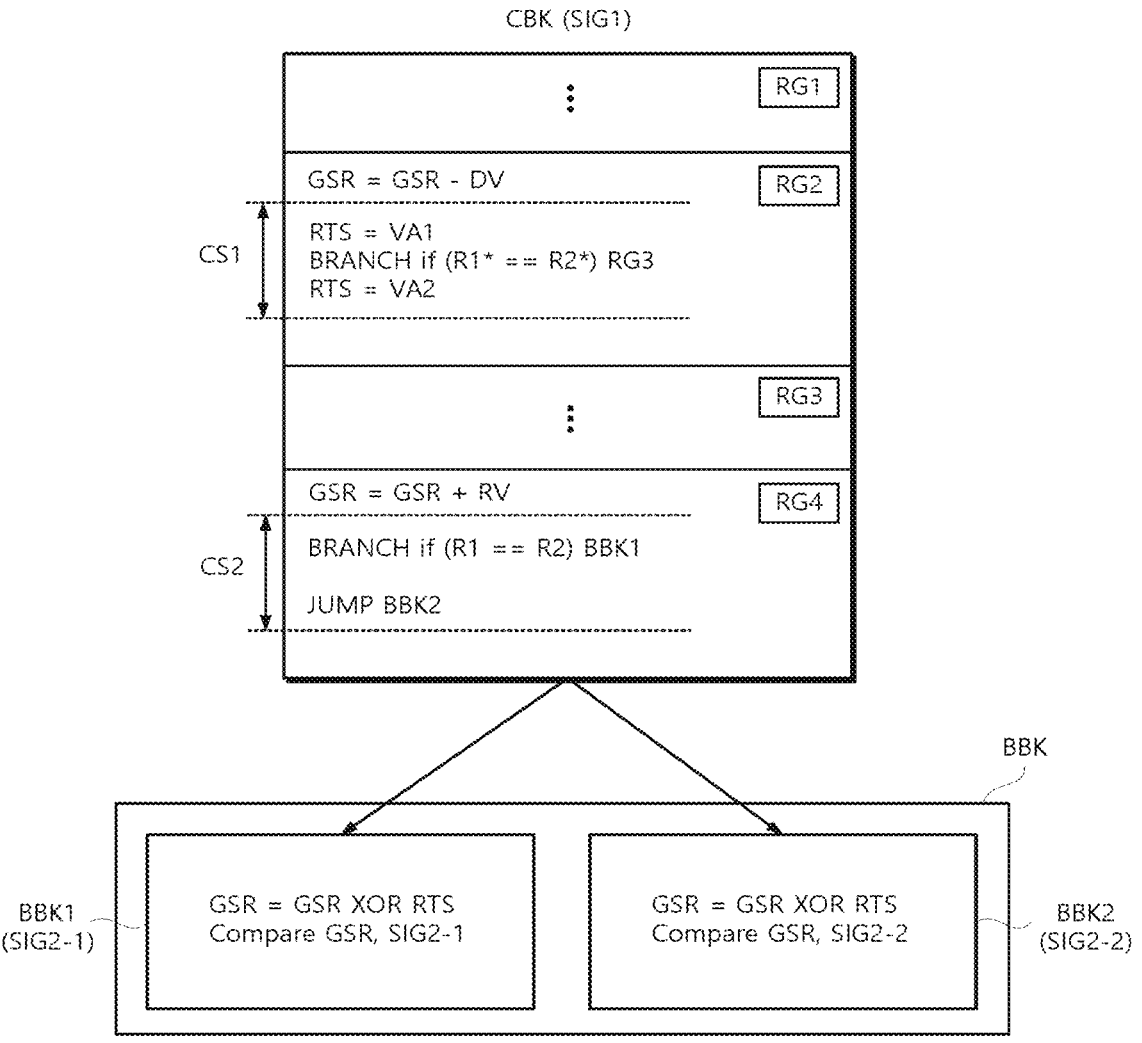
FIG. 7 illustrates a current command block and a branch command block according to some embodiments of the present disclosure.

FIG. 6 is a flowchart illustrating the method 100 of detecting a soft error according to some embodiments of the present disclosure and FIG. 7 illustrates the current command block CBK and a branch command block BBK according to some embodiments of the present disclosure.

Referring to FIGS. 6 and 7, similarly to FIG. 1, the method 100 of detecting a soft error in FIG. 6 includes copying the original branch command OBC to the copied branch command CBC in operation S120, executing the first command set C S1 including the copied branch command CBC in operation S140, executing the second command set CS2 including the original branch command OBC in operation S160, and determining whether an error exists in the execution of the original branch command OBC based on existence of an error in the execution of the first command set CS1 and the second command set CS2 in operation S180. In addition, the method 100 of detecting a soft error in FIG. 6 may further include determining whether an error exists in the execution of the copied branch command CBC before and after the execution of the first command set CS1 in operation S130.

In determining of whether an error exists in the execution of the copied branch command CBC in operation S130, the global signature value may be used to detect the existence of an error. In this regard, the determining whether an error exists in the execution of the copied branch command CBC in operation S130 may include damaging the global signature value GSR of the current command block CBK in operation S132 and restoring the damaged global signature value GSR in operation S134. The determining whether an error exists in the execution of the copied branch command CBC in operation S130 may be performed by the soft error detection unit 260.

According to some embodiments of the present disclosure described above, a unique signature value is given to each command block. For example, the unique signature value for the current command block CBK is set to the first signature value SIG1, the unique signature value for a first branch command block BBK1 is set to a (2-1)-th signature value SIG2-1, and the unique signature value for a second branch command block BBK2 may be set to a (2-2)-th signature value SIG2-2.

The global signature value GSR may be similar to the first signature value SIG1 of the current command block CBK where the command is executed at the present point. At the point when a command block executing a command is changed, the global signature value GSR may be updated to a unique signature value of the changed command block. The global signature value GSR may be stored in one of processor registers (not illustrated) included in the processor 200 of FIG. 2.

Subtracting a damaged value DV from the global signature value GSR (operation S132), that is, a subtraction command by which the damaged value DV is subtracted from the global signature value GSR, may be executed before the first command set CS1. Here, the subtraction command by which the damaged value DV is subtracted from the global signature value GSR may be located in the second region RG2 along with the first command set CS1.

The damaged value DV may be set to a value which may satisfy the following conditions. First, the damaged global signature value GSR may not be overlapped with a unique signature value of other command block included in an application. For example, the unique signature values of the command blocks included in an application are set to have each difference of "100", and the damaged value DV may be set to a value other than "100". Second, the damaged value DV may not be overlapped with a damage value of other command block included in an application. For example, when a damaged value of the first command block is "10", a damaged value of a second command block may be set to a value other than "10".

After the global signature value GSR is damaged, the first command set CS1 may be executed (operation S140).

Figure 8:
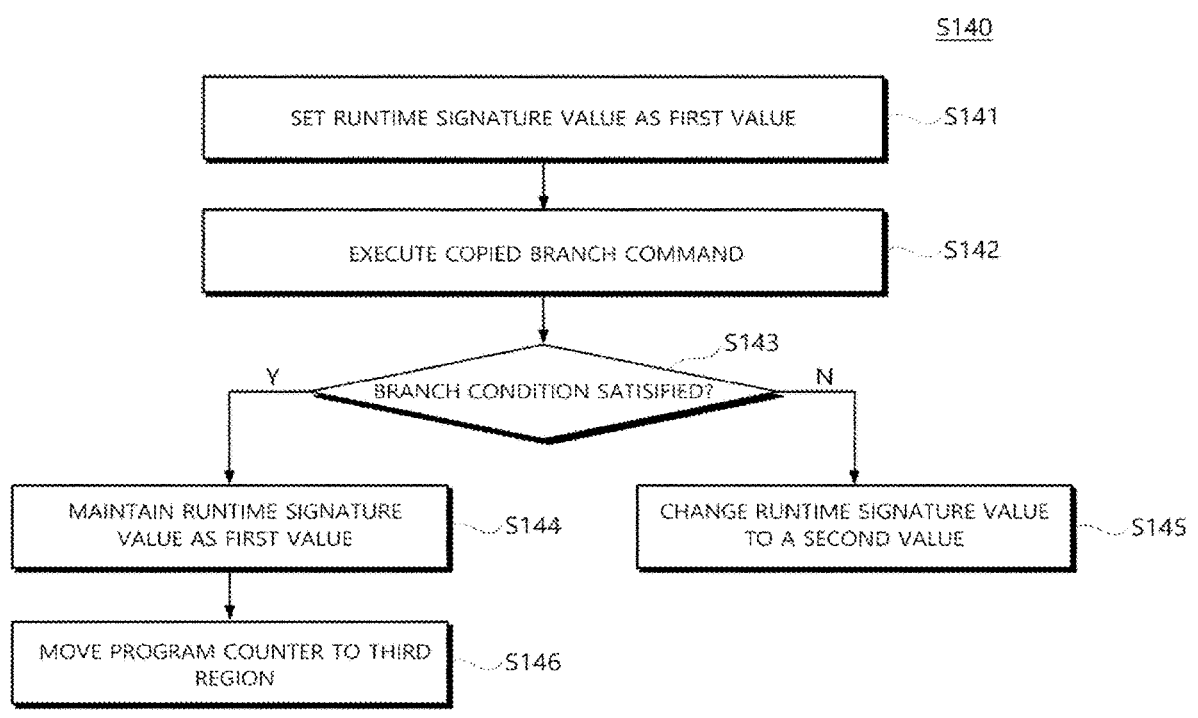
FIG. 8 is a flowchart illustrating executing a first command set according to some embodiments of the present disclosure.

FIG. 8 is a flowchart illustrating executing of the first command set CS1 (operation S140) according to some embodiments of the present disclosure.

Referring to FIGS. 7 and 8, the executing of the first command set CS1 in operation S140 according to some embodiments of the present disclosure may include setting a runtime signature value RTS as a first value VA1 in operation S141, executing the copied branch command CBC in operation S142, maintaining the runtime signature value RTS as the first value VA1 in operation S144 when a branch condition of the branch command CBC is satisfied ("Y") in operation S143, and changing the runtime signature value RTS to a second value VA2 in operation S145 when a branch condition of the branch command CBC is not satisfied ("N") in operation S143.

The runtime signature value RTS may be a value indicating a difference of the unique signature values between the current command block CBK and the branch command block BBK. Here, the first value VA1 may be an XOR value of the unique signature values of the current command block CBK and the first branch command block BBK1 and the second value VA2 may be an XOR value of the unique signature values of the current command block CBK and the second branch command block BBK2. That is, the first value VA1 may be set by an XOR operation for the first signature value SIG1 of the current command block CBK and the (2-1)-th signature value SIG2-1 of the first branch command block BBK1.

The first value VA1 may be set before the execution of the copied branch command CBC (operation S141). As described above, the runtime signature value RTS may be stored in one of processor registers (not illustrated) included in the processor 200 of FIG. 2. In the present disclosure, changing the runtime signature value RTS to the second value VA2 (operation S145) may denote that the second value VA2 stored in one register is used from among the first value VA1 and the second value VA2 of the runtime signature value RTS stored in each different register instead of changing a value of a register storing the runtime signature value RTS.

In the executing the copied branch command CBC (operation S142), a value of a program counter may vary according to whether the copied branch condition is satisfied. For example, when a first copied value R1* obtained by copying the first original value R1 stored in a first register is same as a second copied value R2* obtained by copying the second original value R2 stored in a second register, the program counter may branch to an arbitrary region in the current command block CBK. For example, the program counter may branch to a third region RG3 interposed between the first command set CS1 and the second command set CS2 due to the execution of the copied branch command CBC in operation S146. On the other hand, when the first copied value R1* and the second copied value R2* are different from each other, the program counter may indicate a location of a next command of the copied branch command CBC. Accordingly, changing the runtime signature value RTS to the second value VA2 (operation S145) described above may be performed.

Referring back to FIGS. 6 and 7, determining whether an error exists in the execution of the copied branch command CBC (operation S130) according to some embodiments of the present disclosure may include restoring the damaged global signature value GSR (operation S134) after the execution of the first command set CS1. For example, the damaged global signature value GSR may be restored by adding a restore value RV. An addition command by which the restore value RV is added to the damaged global signature value GSR may be executed before the second command set CS2.

The addition command by which the restore value RV is added to the damaged global signature value GSR may be located in the fourth region RG4 of the current command block CBK along with the second command set CS2. The restore value RV may be same as the damaged value DV. In this case, the condition for the damaged value DV may be applied to the restore value RV as in the same or a similar manner.

Determining whether an error exists in the execution of the copied branch command CBC (operation S130) according to some embodiments of the present disclosure may further include comparing the global signature value GSR before being damaged to the global signature value GSR after being restored in operation S136. When the global signature value GSR is normally damaged and restored, the global signature value GSR for the current command block CBK after being restored may be same as the global signature value GSR before being damaged. On the other hand, when the global signature value GSR before being damaged is not same as the global signature value GSR after being restored, the existence of an error may be detected in the copied branch command CBC as described hereinafter.

Figure 9A:
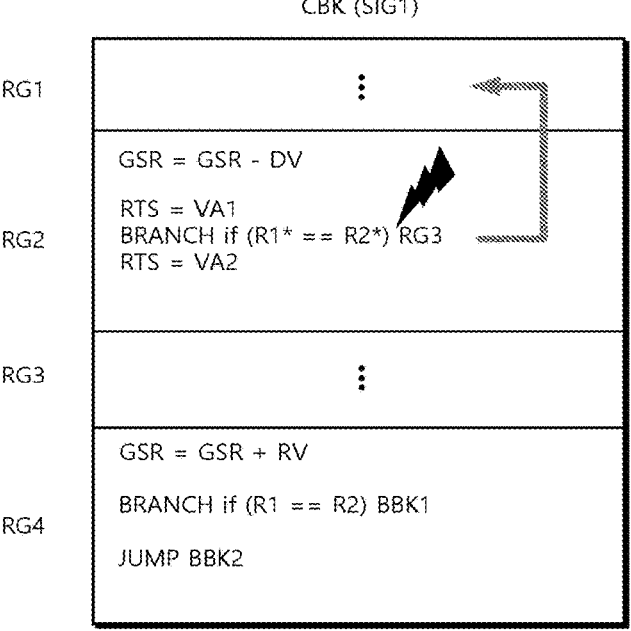
FIGS. 9A through 9C respectively illustrate a moving location of a program counter when an error occurs in a copied branch command according to some embodiments of the present disclosure.
Figures 9B, 9C:
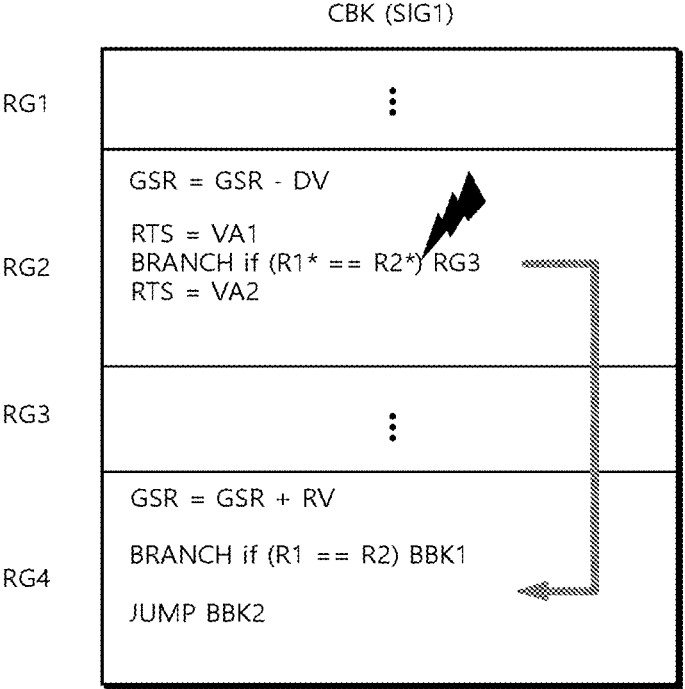

FIGS. 9A through 9C respectively illustrate a moving location of a program counter when an error occurs in the copied branch command CBC according to some embodiments of the present disclosure.

First, referring to FIGS. 6 and 9A, when an error occurs in the copied branch command CBC, the program counter branched by the copied branch command CBC may move to the first region RG1 instead of the third region RG3 of the current command block CBK. When the copied branch command CBC is normally executed as described above, the program counter may move to the third region RG3. The third region RG3 may be interposed between the second region RG2, where the first command set CS1 is located, and the fourth region RG4, where the second command set CS2 is located. In this regard, damaging the global signature value GSR (operation S132) and restoring the damaged global signature value GSR may not be normally executed by one time.

Accordingly, when the global signature value GSR before being damaged is compared to the global signature value GSR after being restored (operation S136), whether an error of the copied branch command CBC exists may be detected. For example, since an error exists in the copied branch command CBC and thereby, the program counter is moved to the first region RG1 instead of the third region RG3, damaging the global signature value GSR (operation S132) may be performed twice and restoring the damaged global signature value GSR (operation S134) may be performed once. Therefore, when the damaged value DV and the restore value RV are "10", the global signature value GSR before being damaged may be greater than the restored global signature value GSR by "10".

Next, referring to FIGS. 6 and 9B, the program counter branched by the copied branch command CBC due to the soft error may move to the fourth region RG4 instead of the third region RG3 of the current command block CBK. Since an error exists in the copied branch command CBC and thereby, the program counter is moved to the fourth region RG4, damaging the global signature value GSR (operation S132) may be performed once and restoring the damaged global signature value GSR (operation S134) may not be performed. Therefore, when the damaged value DV and the restore value RV are "10", the global signature value GSR before being damaged may be greater than the restored global signature value GSR by "10".

Next, referring to FIGS. 6 and 9C, the program counter branched by the copied branch command CBC due to the soft error may move to the second region RG2, where the first command set CS1 including the copied branch command CBC is located, instead of the third region RG3 of the current command block CBK. For example, the program counter may move from the second region RG2 to a location before or after the copied branch command CBC. In this case, damaging the global signature value GSR (operation S132) may be performed once and restoring the damaged global signature value GSR (operation S134) may not be performed. Therefore, when the damaged value DV and the restore value RV are "10", the global signature value GSR before being damaged may be greater than the restored global signature value GSR by "10".

Referring back to FIGS. 6 and 7, in the method 100 of detecting a soft error according to some embodiments of the present disclosure, the damaged global signature value GSR is restored and then, the second command set CS2 including the original branch command OBC may be executed (operation S160). When the first original value R1 of the first register and the second original value R2 of the second register are same as each other as a result of the execution of the second command set CS2, the program counter may move to the first branch command block BBK1 (Branch if (R1 R2) BBK1) or the second branch command block BBK2 (Jump BBK2). This may be a control flow where entry to the first branch command block BBK1 or the second branch command block BBK2 is not acceptable without going through the BRANCH command or the JUMP command in the current command block CBK. Accordingly, when the first original value R1 and the second original value R2 are same as each other, the program counter may be branched to the first branch command block BBK1 and when the first original value R1 and the second original value R2 are different from each other, the program counter may move to the second branch command block BBK2.

Figure 10:
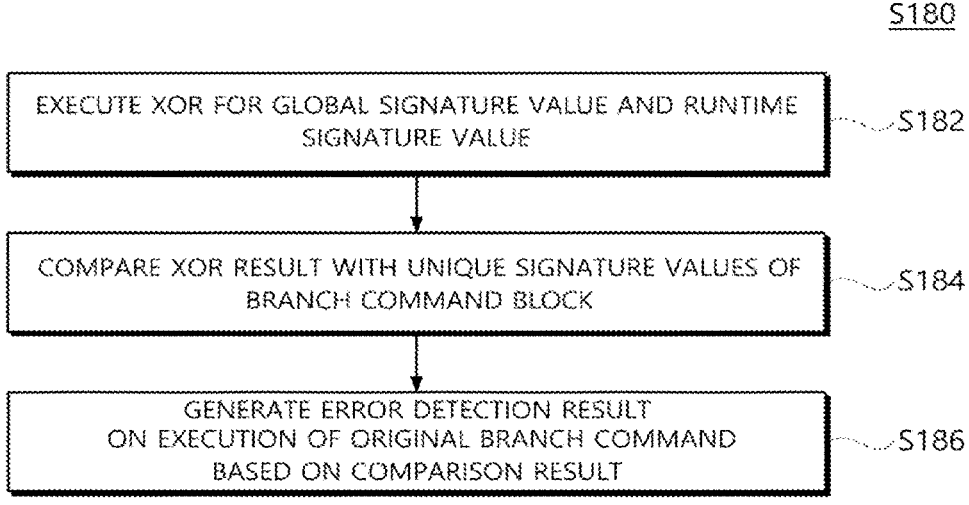
FIG. 10 is a flowchart illustrating determining whether an error exists in execution of an original branch command according to some embodiments of the present disclosure.

FIG. 10 is a flowchart illustrating determining whether an error exists in the execution of the original branch command OBC (operation S180) according to some embodiments of the present disclosure.

Referring to FIGS. 6, 7, and 10, when the execution of the second command set CS2 is completed (operations S120 through S160), determination of whether an error exists in the execution of the original branch command OBC is performed (operation S180) based on the execution result of the first command set CS1 and the second command set CS2 in the method 100 of detecting a soft error according to some embodiments of the present disclosure. Determining whether an error exists in the execution of the original branch command OBC (operation S180) may be performed using the global signature value GSR and the runtime signature value RTS in the branch command block BBK.

For example, determining whether an error exists in the execution of the original branch command OBC (operation S180) may include executing XOR for the global signature value GSR and the runtime signature value RTS in operation S182, comparing the result of XOR with the unique signature values SIG2-1 and SIG2-2 of the branch command block BBK in operation S184, and generating the error detection result on the execution of the original branch command OBC based on the comparison result in operation S186.

For example, when the branch condition of the original branch command OBC is satisfied and thereby, the program counter branches to the first branch command block BBK1, the result obtained by executing XOR for the global signature value GSR and the first value VA1 of the runtime signature value RTS may be compared with the (2-1)-th signature value SIG2-1 of the first branch command block BBK1. Also, when the branch condition of the original branch command OBC is not satisfied and thereby, the program counter is moved to the second branch command block BBK2, the result obtained by executing XOR for the global signature value GSR and the second value VA2 of the runtime signature value RTS may be compared with the (2-1)-th signature value SIG2-1 of the second branch command block BBK2.

The global signature value GSR obtained by executing XOR with the runtime signature value RTS may be same as the first signature value SIG1, as the program counter still indicates the current command block CBK at the time when XOR is executed. The error detection result according to the comparison result may be the error detection signal XED output from the soft error detection unit 260 of FIG. 2.

As described above, the data flow and the control flow may all be protected by using repetition of the data flow in the method 100 of detecting a soft error according to some embodiments of the present disclosure. The processor 200 of FIG. 2 to which the method 100 of detecting a soft error according to some embodiments of the present disclosure is applied is in the same or a similar manner.

In order to prevent vulnerability to the original branch command OBC, that is, no error detection in the control flow, protection for the branch command block BBK, which is to be branched by the original branch command OBC, may be generated through the copied branch command CBC obtained by copying the original branch command OBC in the method 100 of detecting a soft error according to some embodiments of the present disclosure. Protection for the branch command block BBK may denote a basis for determining whether an error does not occur and thereby, entry to the corresponding branch command block BBK is normally available. The protection for the branch command block BBK may be generated by the unique signature values SIG1, SIG2-1, and SIG2-2, the global signature value GSR, and the runtime signature value RTS.

In this case, although, for example, the first original value R1 and the second original value R2 are same as each other and thereby, the program counter is moved to the first branch command block BBK1, the first original value R1 is damaged by a soft error generated in the data flow and thus, the first original value R1 and the second original value R2 are not the same as each other. Accordingly, although the program counter makes a wrong movement to the second branch command block BBK2, an error of the control flow may be sensed. In other words, executing the first command set CS1 (operation S140) and executing the second command set CS2 (operation S160) may each be performed independently. That is, the result of the execution of the first command set CS1 (operation S140) may not affect the result of the execution of the second command set CS2 (operation S160).

Also, detecting an error of the copied branch command CBC (operation S130) is separately performed and thereby, a soft error of the original branch command OBC may be accurately detected. When an error is generated in the copied branch command CBC, the branch command block BBK may be incorrectly generated and thus, it may be hard to accurately detect an error. On the other hand, the copied branch command CBC is also a branch command and may have high error vulnerability.

In the method 100 of detecting a soft error according to some embodiments of the present disclosure, an issue on vulnerability occurring while detecting a soft error in a command set structure such as RISC-V, which does not support a conditional calculation command, may be solved by using an addition command and a subtraction command, which are basic commands. The processor 200 of FIG. 2 to which the method 100 of detecting a soft error according to some embodiments of the present disclosure is applied is in the same or similar manner.

The conditional calculation command denotes a command which conditionally updates a register value such as 'move_equal' and 'move_notEqual'. In the command set structure which supports the conditional calculation command, vulnerability to the copied branch command CBC does not exist, since an arithmetic operation required to execute the conditional calculation command is an arithmetic operation for the data flow. In order to execute the conditional calculation command, a conditional XOR operation and a conditional register copying operation may be required. Accordingly, even if a soft error occurs in the conditional calculation command, the program counter is not changed as jump and branch operations occur. As described above, in the control flow causing a change in the program counter, vulnerability to an error may be more common compared to the data flow.

Although not illustrated, the program counter branched by the copied branch command CBC due to a soft error may move to another command block instead of the current command block CBK. In this case, the soft error may be detected by using a method of detecting an error of an original command, described later. Also, determining whether an error exists in the execution of the copied branch command CBC (operation S130) in FIG. 6 may be selectively performed according to an operating mode of the processor core 220 of FIG. 2. For example, when an error generating rate is below a reference value and thereby, is stable in an arbitrary operating mode, an error check is not performed for the copied branch command CBC and the original branch command OBC may be executed under the assumption that the copied branch command CBC is normally executed.

Figure 12:
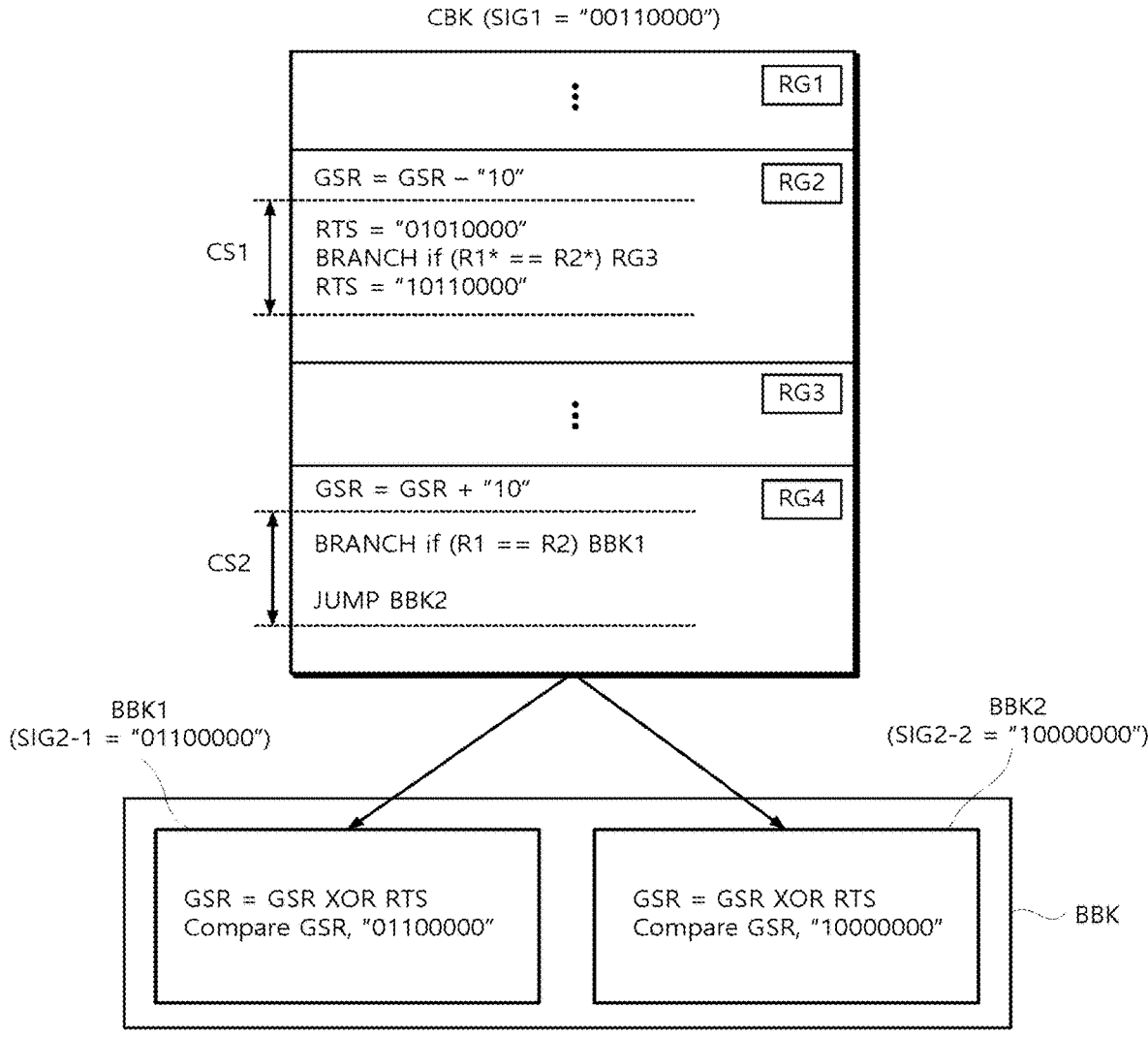
FIG. 12 illustrates a current command block and a branch command block which are operated by using the method of detecting a soft error of FIG. 11.

FIG. 11 is a flowchart illustrating the method 100 of detecting a soft error according to some embodiments of the present disclosure and FIG. 12 illustrates the current command block CBK and the branch command block BBK which are operated by using the method 100 of detecting a soft error of FIG. 11.

Referring to FIGS. 11 and 12, the method 100 of detecting a soft error according to some embodiments of the present disclosure may include damaging the global signature value GSR of the current command block CBK in operation S132, executing the copied branch command CBC having the branch condition which is same as or similar to that of the original branch command OBC in operation S142-2, restoring the damaged global signature value GSR in operation S134, comparing the global signature value GSR before being damaged to the global signature value GSR after being restored in operation S136, and detecting whether an error exists in the execution of the copied branch command CBC based on the comparison result in operation S138. Also, in the method 100 of detecting a soft error according to some embodiments of the present disclosure, following operations may be performed.

FIG. 12 illustrates that the damaged value DV and the restore value RV is respectively "10". Also, the first signature value SIG1 of the current command block CBK may be set to "00110000", the (2-1)-th signature value SIG2-1 of the first branch command block BBK1 may be set to "01100000", and the (2-2)-th signature value SIG2-2 of the second branch command block BBK2 may be set to "10000000". In this regard, at the present point, that is, the global signature value GSR indicating the unique signature value of the current command block CBK indicated by the program counter, may be set to "00110000".

Before the first command set CS1 including the copied branch command CBC is executed, "10" is subtracted from the global signature value GSR and thereby, the global signature value GSR may be damaged (operation S132). In this case, the damaged global signature value GSR becomes "00101100". After the copied branch command CBC is executed, the global signature value GSR is restored in such a way that the restore value RV, which is "10", is added to the damaged global signature value GSR, which is "00101100" (operation S134). As a result of comparison between the global signature value GSR before being damaged and the restored global signature value GSR (operation S136), the values are all "00110000" and thereby, it may be determined that an error does not exist in the execution of the copied branch command CBC (operation S138).

Here, before the copied branch command CBC is executed, the runtime signature value RTS indicating a difference in the unique signature values between the current command block CBK, where the copied branch command CBC is executed, and the branch command block BBK branched by the original branch command OBC may be set to the first value VA1 in operation S141. FIG. 12 illustrates that the first value is "01010000". When the branch condition is satisfied, that is, when the first copied value R1* and the second copied value R2* are the same as each other, the program counter may move to the third region RG3 of the current command block CBK. Here, the runtime signature value RTS may be fixed to the first value which is "01010000" in operation S144.

On the other hand, when the branch condition is not satisfied as a result of the execution of the copied branch command CBC, the runtime signature value RTS is changed to the second value VA2 which is different from the first value in operation S145. In other words, when the branch condition is not satisfied, that is, when the first copied value R1* and the second copied value R2* are different from each other, the program counter increases by 1 and the runtime signature value RTS may be fixed to the second value which is "10110000". The first value of the runtime signature value RTS may correspond to the (2-1)-th signature value SIG2-1 of the first branch command block BBK1 and the second value of the runtime signature value RTS may correspond to the (2-2)-th signature value SIG2-2 of the second branch command block BBK2.

Whether an error exists in the execution of the original branch command OBC may be detected based on the runtime signature value RTS fixed as a result of the execution of the copied branch command CBC in operation S180-2.

First, the original branch command OBC is executed. When the branch condition of the original branch command OBC is satisfied, that is, when the first original value R1 and the second original value R2 are the same as each other, the program counter may move to the first branch command block BBK1. Here, an XOR operation for the global signature value GSR, which is "00110000", and the runtime signature value RTS, which is "01010000", is performed. The result of the XOR operation is "01100000" which is the same as the (2-1)-th signature value SIG2-1 of the first branch command block BBK1 to be branched. In this regard, it may be identified that an error does not exist in the execution of the original branch command OBC.

When it is determined that an error exists in the first original value R1 and thereby, the first original value R1 and the second original value R2 are different from each other, the program counter may move to the second branch command block BBK2 according to the execution of the original branch command OBC. However, the result value, which is "01100000", obtained by the XOR operation for the global signature value GSR, which is "00110000", and the runtime signature value RTS, which is "01010000", is different from the (2-2)-th signature value SIG2-2 of the second branch command block BBK2 to be branched, which is "10000000". Accordingly, the existence of an error in the execution of the original branch command OBC may be detected.

FIGS. 11 and 12 may illustrate an example in which one of the software-based command overlap techniques, which is CompreHensive In-Thread InstructioN replication technique against transient faults (CHITIN), is applied. However, the present disclosure is not limited thereto. The method of detecting a soft error according to some embodiments of the present disclosure may be applied to various software-based command overlap techniques in addition to CHITIN. The method is performed by a processor that is operating in an Instruction Set Architecture which does not support a command that conditionally updates a register value.

Figure 13:
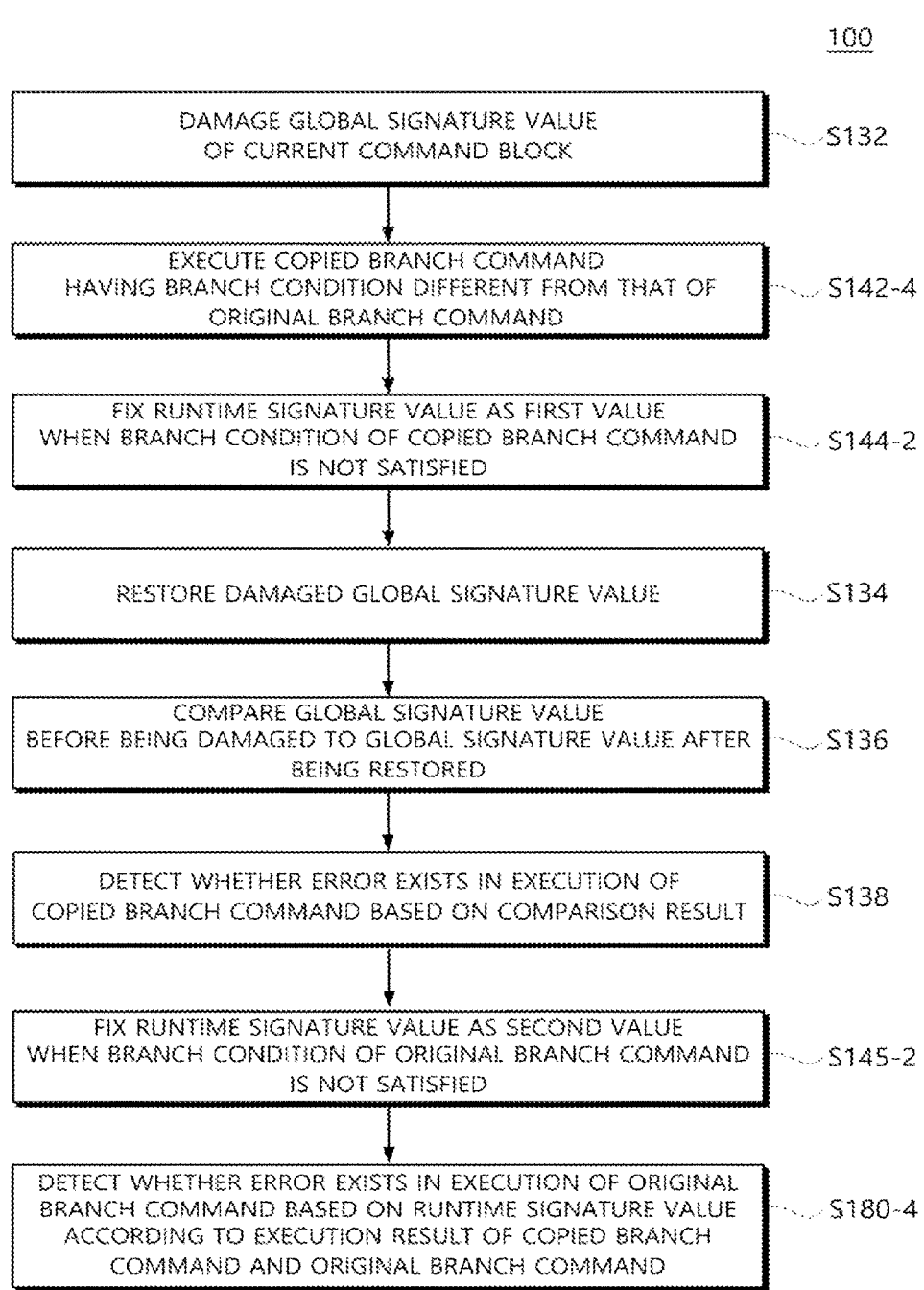
FIG. 13 is a flowchart illustrating a method of detecting a soft error according to some embodiments of the present disclosure.
Figure 14:
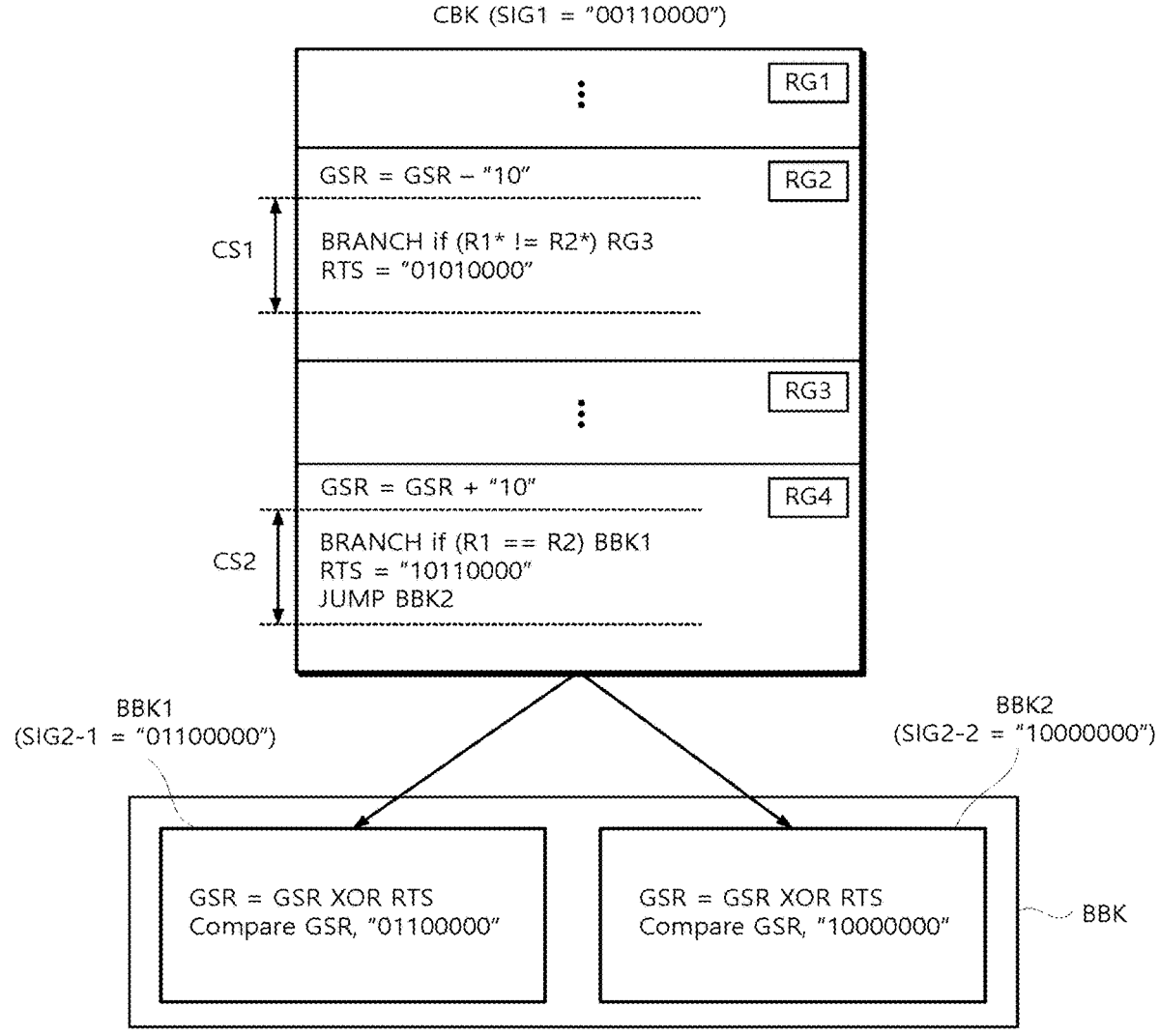
FIG. 14 illustrates a current command block and a branch command block which are operated by using the method of detecting a soft error of FIG. 13.

FIG. 13 is a flowchart illustrating the method 100 of detecting a soft error according to some embodiments of the present disclosure and FIG. 14 illustrates the current command block CBK and the branch command block BBK which are operated by using the method 100 of detecting a soft error of FIG. 13.

Referring to FIGS. 13 and 14, the method 100 of detecting a soft error according to some embodiments of the present disclosure may include damaging the global signature value GSR of the current command block CBK in operation S132, executing the copied branch command CBC having the branch condition which is different from that of the original branch command OBC in operation S142-4, restoring the damaged global signature value GSR in operation S134, comparing the global signature value GSR before being damaged to the global signature value GSR after being restored in operation S136, and detecting whether an error exists in the execution of the copied branch command CBC based on the comparison result in operation S138. Also, in the method 100 of detecting a soft error according to some embodiments of the present disclosure, following operations may be performed.

The unique signature values SIG1, SIG2-1, and SIG2-2 of the current command block CBK and the branch command block BBK in FIG. 14 may be all same as or similar to those in FIG. 12. However, in FIGS. 13 and 14, the branch condition of the original branch command OBC and the branch condition of the copied branch command CBC are different from each other. For example, when whether the first original value R1 and the second original value R2 are same as each other is the branch condition of the original branch command OBC, whether the first copied value R1* and the second copied value R2* are different from each other may be the branch condition of the copied branch command CBC.

Before the first command set CS1 including the copied branch command CBC is executed, "10" is subtracted from the global signature value GSR and thereby, the global signature value GSR may be damaged (operation S132). In this case, the damaged global signature value GSR becomes "00101100". After the copied branch command CBC is executed, the global signature value GSR is restored in such a way that the restore value RV, which is "10", is added to the damaged global signature value GSR, which is "00101100" (operation S134). As a result of comparison between the global signature value GSR before being damaged and the restored global signature value GSR (operation S136), the values are all "00110000" and thereby, it may be determined that an error does not exist in the execution of the copied branch command CBC (operation S138).

Here, when the branch condition of the copied branch command CBC is not satisfied, the runtime signature value RTS may be set to the first value VA1. For example, when the first copied value R1* and the second copied value R2* are same as each other and thereby, the branch condition of the copied branch command CBC is not satisfied, the runtime signature value RTS may be fixed to the first value which is "01010000". On the other hand, when the branch condition of the copied branch command CBC is satisfied and the branch condition of the original branch command OBC is not satisfied as a result of the execution of the original branch command OBC, the runtime signature value RTS may be set to the second value VA2, which is different from the first value in operation S145-2. For example, when the first copied value R1* and the second copied value R2* are different from each other and the first original value R1 and second original value R2 are not same as each other, the runtime signature value RTS may be fixed to the second value which is "10110000".

That is, the location of the first value, which is "01010000", in the runtime signature value RTS is set to be after the copied branch command CBC within the current command block CBK and the location of the second value, which is "10110000", in the runtime signature value RTS is set to be after the original branch command OBC within the current command block CBK.

In addition, detecting whether an error exists in the execution of the original branch command OBC based on the runtime signature value RTS fixed as a result of the execution of the copied branch command CBC and the original branch command OBC in operation S180-4 may be same as or similar to operations in FIGS. 11 and 12. FIGS. 13 and 14 may illustrate an example to which one of software-based command overlap techniques, which is Software Implemented Fault Tolerance (SWIFT), is applied.

Techniques such as software implemented fault tolerance (SWIFT) and Comprehensive in-thread instruction replication (CHITIN) protect both data flow and control flow based on software modification. However, these techniques have vulnerability in an Instruction Set Architecture (ISA) since a conditional calculation command is not supported. Since the conditional calculation command is not supported, a soft error may be generated while executing newly added branch calculation, an error may be generated in such a way that a program counter moves to another arbitrary point instead of omitting calculation of a RTS value. In the processor and the method of detecting a soft error using the same according to some embodiments of the present disclosure, a soft error may be accurately detected without using a conditional calculation. Accordingly, a malfunction occurring due to a soft error may be prevented and operating reliability may be improved. Thus, the embodiments described herein provide a practical application in the form of a technical solution to the problem of detecting soft errors accurately without using a conditional calculation.

Although representative embodiments of the present disclosure have been described in detail above, those of ordinary skill in the art to which the present disclosure pertains will understand that various modifications are capable of being made to the above-described embodiments without departing from the scope the present disclosure. For example, as above, damaging the global signature value GSR (operation S132) is performed by subtracting the damaged value DV from the global signature value GSR and restoring the damaged global signature value GSR (operation S134) is performed by adding the restore value RV to the damaged global signature value GSR. However, the present disclosure is not limited thereto. In the method 100 of detecting a soft error using the processor 200 according to some embodiments of the present disclosure, damaging the global signature value GSR (operation S132) may be performed by adding the damaged value DV to the global signature value GSR and restoring the damaged global signature value GSR (operation S134) may be performed by subtracting the restore value RV from the damaged global signature value GSR. In addition, damaging the global signature value GSR (operation S132) and restoring the damaged global signature value GSR (operation S134) may be performed by using various arithmetic operations such as division or multiplication in addition to subtraction or addition.

Therefore, the scope of the present disclosure should not be limited to the described embodiments, but it should be defined by not only the claims described below, but also the claims and equivalents.

What is claimed is:

1. A method of detecting a soft error comprising:
copying, in a program loaded into a memory, an original branch command to a copied branch command;
executing, by a processor, a first command set comprising the copied branch command;
determining, by a soft error detection circuit, whether an error exists in execution of the copied branch command by using a global signature value for a current command block of the program in which the first command set is executed;
executing, by the processor, a second command set comprising the original branch command;
determining, by the soft error detection circuit, whether an error exists in the execution of the original branch command based on an execution result of the first command set and the second command set from the processor;

generating, by the processor, an error detection signal when the error exists in execution of the original branch command; and outputting, by the processor, the error detection signal when the error exists.

2. The method of claim 1, wherein the determining whether the error exists in the execution of the copied branch command comprises performing operations comprising:

damaging the global signature value; and restoring the global signature value that was damaged.

3. The method of claim 2, wherein the damaging the global signature value comprises subtracting a damage value from the global signature value, and wherein the restoring the global signature value that was damaged comprises adding a restore value to the global signature value that was damaged.

4. The method of claim 3, wherein the damage value and the restore value are same as each other.

5. The method of claim 1, wherein the determining whether the error exists in the execution of the copied branch command comprises comparing the global signature value before being damaged to the global signature value after being restored.

6. The method of claim 1, wherein the determining whether the error exists in the execution of the copied branch command is selectively performed when an error generating rate of the processor is below a reference value.

7. The method of claim 1, wherein the executing the first command set comprises:

setting a runtime signature value as a first value, wherein the runtime signature value corresponds to a branch command block that was accessed during execution of the original branch command;

executing the copied branch command;

maintaining the runtime signature value as the first value when a branch condition of the copied branch command is satisfied; and changing the runtime signature value to a second value from the first value when a branch condition of the copied branch command is not satisfied.

8. The method of claim 7, wherein the first value is obtained by an XOR operation of a unique signature value for a current command block where the copied branch command is executed and a unique signature value of one of a plurality of branched command blocks that was branched as a result of the execution of the second command set, and wherein the second value is obtained by an XOR operation of the unique signature value for the current command block and a unique signature value of a different one of the branched command blocks.

9. The method of claim 7, wherein the executing the first command set further comprises:

moving a program counter of a current command block where the copied branch command is executed to a region between the first command set of the current command block and the second command set of the current command block, when a branch condition of the copied branch command is satisfied.

10. The method of claim 7, wherein the runtime signature value indicates a difference in unique signature values between a current command block and the branch command block.

11. The method of claim 1, wherein the executing the second command set comprises:

moving a program counter to a first branch command block from among branch command blocks, when a branch condition of the original branch command is satisfied; and moving a program counter to a second branch command block from among the branch command blocks, when a branch condition of the original branch command is not satisfied.

12. The method of claim 11, wherein the determining whether the error exists in the execution of the original branch command comprises:

performing an XOR operation on a global signature value of a current command block and a runtime signature value corresponding to the first branch command block or the second branch command block;

comparing a value obtained by the XOR operation to a unique signature value of the first branch command block or the second branch command block; and generating an error detection result of the execution of the original branch command based on a result of the comparing.

13. The method of claim 1, wherein the executing the first command set and the executing the second command set are performed independently of one another.

14. The method of claim 1, wherein the method is applied to CompreHensive In-Thread Instruction replication technique against transient faults (CHITIN) or Software Implemented Fault Tolerance (SWIFT) from among software-based command overlap techniques.

15. The method of claim 1, wherein the method is performed by the processor that is configured to operate in an Instruction Set Architecture which does not support a command for conditionally updating a register value.

16. A processor which is operated by the method of claim 1 and outputs an error detection signal when an error exists in execution of the original branch command.

17. A method of detecting a soft error comprising:

damaging, by a processor, a global signature value of a current command block that is in a memory;

executing, by the processor, a copied branch command which corresponds to an original branch command;

restoring, by the processor, the global signature value that was damaged;

comparing, by the processor, the global signature value before being damaged to the global signature value after being restored; and determining whether an error exists in the execution of the copied branch command based on a result of the comparing.

18. The method of claim 17, wherein the copied branch command has a branch condition which is same as that of the original branch command, the method further comprising:

setting a runtime signature value as a first value before the copied branch command is executed, wherein the runtime signature value indicates a difference in a unique signature value between the current command block where the copied branch command is executed and a branch command block that is accessed by the original branch command;

maintaining the runtime signature value as the first value when a branch condition of the copied branch command is satisfied as a result of execution of the copied branch command, and changing the runtime signature value to a second value from the first value when the branch condition of the copied branch command is not satisfied; and determining whether an error exists in the execution of the original branch command based on the runtime signature value according to the result of the executing of the copied branch command.

19. The method of claim 18, wherein the copied branch command has a branch condition which is different from that of the original branch command and further comprising:

setting a runtime signature value as a first value when the branch condition of the copied branch command is not satisfied, wherein the runtime signature value indicates a difference in unique signature values between the current command block, where the copied branch command is executed, and branch command blocks branched by the original branch command;

changing the runtime signature value to a second value from the first value when the branch condition of the original branch command is not satisfied as a result of the execution of the original branch command; and detecting whether an error exists in the execution of the original branch command based on the runtime signature value according to the execution results of the copied branch command and the original branch command.

* * * * *